April 3, 1962 J. C. LOGUE ET AL 3,028,506
BINARY TYPE PULSE HANDLING DEVICE
Filed May 21, 1956

INVENTORS
JOSEPH C. LOGUE
JAMES L. WALSH
BY
Alvin J. Riddles
AGENT

United States Patent Office 3,028,506
Patented Apr. 3, 1962

3,028,506

BINARY TYPE PULSE HANDLING DEVICE

Joseph C. Logue, Poughkeepsie, and James L. Walsh, Hyde Park, N.Y., assignors to International Business Machines Corporation, New York, N.Y., a corporation of New York Filed May 21, 1956, Ser. No. 586,267
17 Claims. (Cl. 307—88.5)

This invention relates to pulse circuitry and in particular to a binary type pulse handling device for bistable circuits.

In bistable circuits of the Eccles-Jordan type, in order to cause alternate shifting of the circuit from one stable state to the other, in response to successive pulses of the same polarity, it is necessary to produce at a control point associated with a first active element in the circuit, a potential shift such that it will turn on that active element and, at very nearly the same time it is necessary to produce at a control terminal of the second active element, a potential shift such that it will turn that element off.

In the past, this has been accomplished by providing two passive pulse steering elements, such as diodes, one terminal of each being connected to a single input terminal for input pulses and the other terminal of each passive device being connected to the control terminal of each active element in the Eccles-Jordan type trigger.

What has been discovered is that a transistor may be used in pulse handling applications to provide bilateral current flow, phase inversion and power gain. The transistor may be applied to an Eccles-Jordan type trigger by using the base electrode as a binary input terminal and by connecting interchangeably the emitter or collector electrodes to the control terminals of the active elements of the trigger. In such an application the transistor provides the necessary phase inverted shift in potential level at both active elements of the trigger and at the same time the power gain is achieved between the input pulse and the potential shift at the active elements.

Accordingly, a primary object of this invention is to provide an improved pulse handling device containing an active transistor element.

Another object is to provide an improved binary type steering circuit for Eccles-Jordan type bistable circuits.

Still another object is to provide a simplified three transistor Eccles-Jordan type trigger.

Other objects of the invention will be pointed out in the following description and claims and illustrated in the accompanying drawings, which disclose, by way of example, the principle of the invention and the best mode, which has been contemplated, of applying that principle.

Figure 1:
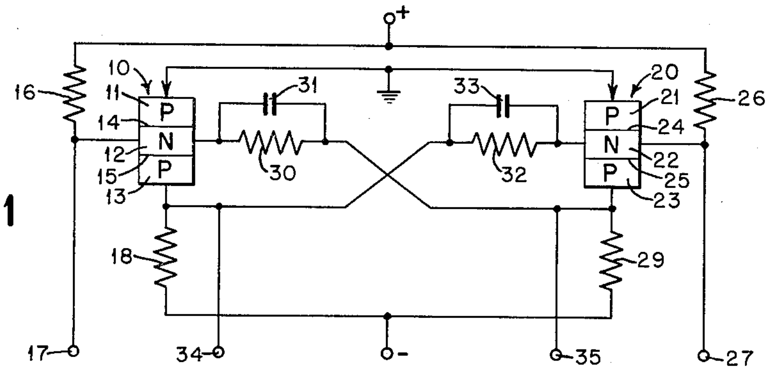
FIGURE 1 illustrates a typical two transistor Eccles-Jordan type bistable circuit.

Referring now to FIGURE 1, the transistor trigger illustrated comprises two junction transistors 10 and 20. Transistor 10 comprises an emitter zone 11, a base zone 12, and a collector zone 13 each separated by junction barriers 14 and 15 respectively. The emitter 11 is connected to ground or to reference potential. The base 12 is connected to positive potential through resistor 16 and to terminal 17. The collector 13 is connected to negative potential through resistor 18. Transistor 20 has an emitter zone 21, a base zone 22 and a collector zone 23 each separated by barriers 24 and 25 respectively. The emitter of transistor 20 is connected to ground. The base of transistor 20 is connected to positive potential through resistor 26 and is connected to terminal 27. The collector of transistor 20 is connected to negative potential through resistor 29. The base of transistor 10 is coupled to the collector of transistor 20 through resistor 30 and capacitor 31 is parallel. Similarly, the base 22 of transistor 20 is coupled to the collector 13 of transistor 10 through resistor 32 and capacitor 33 in parallel. Terminal 34 is connected to the collector of transistor 10 and terminal 35 is connected to the collector of transistor 20.

The transistor trigger of FIGURE 1 is of the Eccles-Jordan type and assuming the transistor 10 to be conducting, the base 12 of transistor 10 is held slightly below ground potential by virtue of the fact that it is connected to the essentially negative potential at collector 23 of transistor 20 through resistor 30. The collector 13 of transistor 10 is at essentially ground potential. In order to cause the trigger circuit of FIGURE 1 to change state, it is necessary to either cut off conduction in transistor 10 or initiate conduction in transistor 20 or both cut off conduction in transistor 10 and simultaneously initiate conduction in transistor 20. If conduction is cut off in transistor 10 by raising the potential of the base 12 to a level sufficient to reverse bias barrier 14, current flowing through resistor 18 will be sharply diminished and the potential of the collector 13 of transistor 10 will drop sharply toward the negative potential, this potential drop at this point is applied through resistor 32 and capacitor 33 to the base 22 of transistor 20 effectively pulling it below ground potential and initiating conduction in the transistor 20, thereby causing a change in the state of the trigger circuit. Transistor 10 is thereafter held out of conduction by the positive potential applied to the base region 12 through resistor 16.

It is also possible to cause a trigger circuit of this nature to change state by applying a negative pulse to the non-conducting transistor 20 thereby initiating conduction. The collector 23 then moves toward positive potential as a result of the current through its load resistor 29 and will transmit a positive pulse through resistor 30 and capacitor 31 to the base 12 of transistor 10 driving it positive and cutting off conduction.

The most rapid type of switching occurs when simultaneously a positive pulse is applied to the base 12 of the conducting transistor 10 and a negative pulse is applied to the base 22 of the non-conducting transistor 20. In FIGURE 1, assuming transistor 10 to be conducting, if a positive pulse were applied to terminal 17 and simultaneously a negative pulse were applied to terminal 27, the effect of the positive pulse on terminal 17 would be to drive the base 12 of transistor 10 positive with respect to the emitter 11 cutting off conduction. At the same time, the negative pulse at terminal 27 would drive the base 22 of transistor 20 negative with respect to the emitter 21 and initiate conduction.

It has been found that for optimum binary operation a junction transistor will provide bilateral current flow, phase inversion and power gain such that in use as a pulse handling device for the binary operating type trigger shown in FIGURE 1, it will provide an optimum condition necessary for most rapid switching of the trigger circuit and it will achieve this with a power gain over the power applied at the input terminal.

Figure 2:
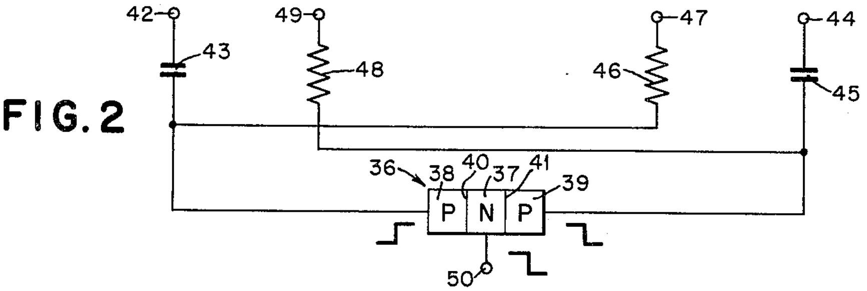
FIGURE 2 illustrates a first embodiment of this invention.

Referring now to FIGURE 2, a junction transistor 36 is shown having a central zone 37, and external zones 38 and 39 each separated from tthe central zone by junction barriers 40 and 41 respectively. Zones 38 and 39 correspond to the emitter and collctor zones of a junction transistor interchangeably and the zone 37 corresponds to the base. Zone 38 is connected to terminal 42 through capacitor 43 and zone 39 is connected to terminal 44 through capacitor 45. Zone 38 is connected through resistor 46 to terminal 47 and similarly zone 39 is connected through resistor 48 to terminal 49, for purposes to be later explained. The pulse handling device of FIGURE 2, when connected to the circuit of FIGURE 1 by joining terminals 17 and 42, 34 and 49, 35 and 47 and 27 and 44 will serve to operate the trigger structure of FIGURE 1 from one stable state to another by successive application pulses of negative polarity applied to the base zone 37 through input terminal 50. The pulse handling device of this invention will achieve this switching, using pulses having considerably less power than is normally required to switch this trigger circuit and, due to the simultaneous action, switching can be achieved with pulses of a shape not acceptable to most trigger circuits of this type.

Considering FIGURES 1 and 2 and assuming transistor 10 to be conducting, zone 38 of transistor 36 will be at the negative potential of the collector 23 of the non-conducting transistor 20 by being connected thereto through resistor 46. At the same time, zone 39 will be at essentially the ground potential of conducting transistor 10 by being connected thereto through resistor 48. Transistor 36 presents in this condition a high impedance to current flow between zones 38 and 39 as a result of reverse bias on junction 41. The high impedance between zones 38 and 39 through the transistor 36 is maintained by holding the zone 37 at a potential that is positive with respect to zone 39 so that a reverse bias is maintained on juncton 41. The amount of reverse bias across the control junction, which under these conditions is junction 41, is not critical and so long as any potential difference, however small, exists in the proper direction the high impedance will be maintained. In practice potential differences of as low as .01 volt are acceptable.

Under the conditions above described, both the zones 39 and 37 of transistor 36 are at the positive or essentially ground potential level, assuming for purposes of explanation that the level at terminal 50 varies between ground and negative, and the zone 38 is at the negative potential level, thus there is high impedance to current flow through the transistor 36 and the difference in potential level is primarily across junction 40. These potential levels are shown in FIGURE 2 at the respective zones 37, 38 and 39. When the potential level drops at terminal 50, the reverse bias on junction 41 is overcome, the transistor then presents a low impedance to current flow therethrough, zone 38 moves toward positive potential and zone 39 moves toward negative potential, thus a phase of inversion of potential takes place between zones 38 and 39. As a result of the single potential change at zone 37, these opposite potential levels simultaneously are applied to the bases of transistors 10 and 20 such that the increase of potential at zone 38 passes a positive pulse through capacitor 43 to the base 12 and cuts off conduction in transistor 10. Simultaneously, the drop in potential level at zone 39 coupled through capacitor 45 drives base 22 of transistor 20 negative and initiates conduction therein. Once the circuit of FIGURE 1 has assumed the stable state in which transistor 20 is conducting, return of potential to a positive level at zone 37 of transistor 36 will have no effect because at this point there is no appreciable potential drop across the transistor 20. Under the conditions of this stable state, in which transistor 20 is conducting, zone 38 is at essentially ground potential by being connected, through resistor 46 to the collector 23 of transistor 20 and zone 39 is at negative potential by being connected through resistor 48 to the collector 13 of transistor 10. A reverse bias now exists on junction 40 of transistor 36 so that in this stable state junction 40 becomes the control junction and a subsequent negative pulse applied to zone 37 will overcome the reverse bias on this junction and will apply pulses of opposite polarity to the bases of transistors 10 and 20 returning the trigger to the initial stable state.

It is essential only that the transistor 36 be capable of bilateral current flow. In practice, some transistors are constructed to favor current flow from one terminal to another, for example from emitter to collector. For purposes of this invention any transistor, although having more than three terminals and though favored for one direction of current flow, is suitable, providing bilateral current flow can take place at sufficient magnitude to accomplish the purpose of the device. It being necessary only that the impedance between two terminals be controllable by signals at a third and that a sufficient degree of bilateral current flow be possible between the two terminals.

Figure 3:
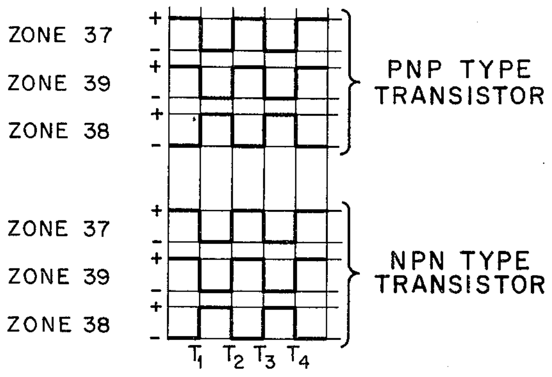
FIGURE 3 shows the potential levels at the respective terminals of the embodiment of FIGURE 2.

Referring now to FIGURE 3, the potential level at zones 39 and 38 are shown as a result of potential level changes at zone 37 for both the PNP transistor and for a NPN type transistor. It should be noted that the properties of bilateral current flow, phase inversion and power gain between zone 37 and zones 38 and 39 are present in both types of transistors, so that for purposes of this invention, as illustrated in FIGURE 3, by the manner in which the potential at the external zones 38 and 39 follow the potential variations at zone 37, the NPN type of transistor is interchangeable with the PNP type of transistor in all applications of this invention.

Figure 4:
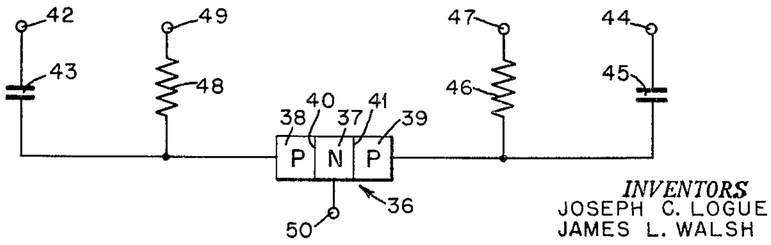
FIGURE 4 illustrates a second embodiment of this invention.

A second embodiment of the pulse handling device of this invention is shown in FIGURE 4. In this embodiment, like reference numbers with that of FIGURE 2, are shown for like components. When this embodiment is connected to the transistor trigger of FIGURE 1 by connecting terminal 42 to terminal 17, terminal 49 to terminal 34, terminal 47 to terminal 35, terminal 44 to terminal 27, it will serve to switch the transistor trigger of FIGURE 1 from one stable state to the other in response to successive positive pulses applied to the base zone 37.

Considering transistor 10 in the conducting condition, a current path takes place between positive potential at the collector 13 of transistor 10 through resistor 48 through transistor 36, through resistor 46 to negative potential at the collector of the non-conducting transistor 20. In this condition, transistor 36 presents a low impedance to current flow and the current flowing in this path from one collector to another causes the external zones 38 and 39 of the transistor to assume nearly the same potential. A positive rise of potential at the central zone 37 will cut off conduction through the transistor by reverse biasing junction 40. This cutting off of conduction through the transistor permits zone 38 to seek the level of the collector of transistor 10 and permits zone 39 to seek the level of the collector of transistor 20. In other words, upon application of a positive pulse to the central zone 37, external zone 38 rises in potential, which potential rise is applied through capacitor 43 to the base 12 of transistor 10 cutting off conduction, simultaneously zone 39 falls in potential, which change of potential is applied through capacitor 45 to the base 22 of non-conducting transistor 20 turning it on.

The pulse handling device of this invention is capable of providing a phase inversion of potential and bi-lateral current flow between any two points in a circuit and it may provide these features under the control of input signals of either polarity and of a magnitude that is small in relation to the current being switched. This device may be compared in function to a binary trigger in that for successive input pulses of the same polarity at the central zone 37, opposite polarity levels appear at the external zones 38 and 39. This device is superior to a binary trigger in that the phase inversion of potential at external zones 38 and 39 is independent of the polarity of the successive input pulses at zone 37.

The major difference between this device and a binary trigger is that although power gain is achieved between input zone 37 and one of the external zones 38 and 39, any power supplied by either zones 38 or 39 to an external load must be applied at the other zone. Hence, the pulse handling device of this invention may be applied to any circuit in which there are two points operating at different potential levels and where it is desirable that these potential levels move toward each other under the influence of a single pulse.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claims.

What is claimed is:

1. A binary type bistable circuit comprising a first active element having an input, output and control electrodes, a second active element having an input, output and control electrodes, means connecting said input electrodes to a first value of potential, means coupling said output electrodes through load impedances to a second value of potential, means coupling said control electrodes to a third value of potential inhibiting thereby conduction through said first and said second active elements, means coupling each said control electrode of one said active element to said output electrode of the other said active element, a junction transistor having three zones of alternately opposite conductivity type capable of bilateral current flow wherein the impedance between a first and a second of said three zones is controllable in response to signals applied to a third zone separating said first and second zones, means capacitively coupling said first zone of said transistor to said control electrode of said first active element, means capacitively coupling said second zone of said transistor to said control electrode of said second active element and means applying a different potential to said first and to said second zones of said transistor.

2. A binary pulse gate for causing the potential level of two points of a circuit having different potential levels to move toward each other, comprising a semi-conductor device having at least first and second external zones of one conductivity type separated by an internal zone of opposite conductivity type capable of bilateral current flow wherein the impedance between the external zones is controllable in response to signals applied to said internal zone, means coupling said first external zone to the first point of said circuit having a first potential, means coupling said second external zone to the second point of said circuit having a potential different from said first potential and means coupling successive pulses of one polarity to said internal zone said internal zone remaining unconnected except in the presence of said pulses.

3. The pulse gate of claim 2 wherein said semi-conductor device is a junction transistor.

4. In combination with a flip-flop having two stable states of operation and including a first and a second transistor of the same conductivity type, each said transistor having a base electrode and a collector electrode, first means providing a direct-current conductive connection between the collector of said first transistor and the base of said second transistor, second means providing a direct-current conductive connection between the collector of said second transistor and the base of said first transistor, a trigger circuit for changing said flip-flop from one of said stable states to the other in response to trigger pulses, said circuit comprising a trigger transistor having a base, a collector, and an emitter electrode, the collector of said trigger transistor being coupled to said first conductive connection providing means, the emitter of said trigger transistor being coupled to said second conductive connection providing means, and circuit means coupled to the base of said trigger transistor for receiving said trigger pulses.

5. A flip-flop circuit comprising in combination, a first and a second semi-conductive device of the same conductivity, each of said devices including a base and a collector electrode, first means providing a direct-current conductive connection between the collector electrode of said first semi-conductive device and the base electrode of said second semi-conductive device, second means providing a direct-current conductive connection between the collector electrode of said second semi-conductive device and the base electrode of said first semi-conductive device, a substantially symmetrical trigger transistor having an input electrode and two output electrodes, the first of said output electrodes being coupled to the collector of said first semi-conductive device, the second of said output electrodes being coupled to the collector of said second semi-conductive device, and circuit means coupled to said input electrode and adapted to receive trigger pulses for forward biasing one of said output electrodes with respect to said input electrode.

6. In combination with a symmetrical bistable multivibrator having two symmetrically located junctions therein, each of which is maintained at a different one of two different potential levels, means for triggering said multivibrator including a steering transistor with an emitter connected to one of said junctions, a collector connected to the other of said junctions and a base to which input signals are applied, said steering transistor having normal and inverted alpha characteristics which are equal.

7. A circuit comprising a bistable transistor circuit having two outputs of opposite polarity, a trigger input transistor having a base electrode and two other electrodes which are individually connected to the outputs of said bistable transistor circuit, said trigger input transistor being of a type having substantially equal gain in either direction of conduction, and means for applying trigger pulses to the base electrode of said trigger input transistor.

8. A transistor flip-flop circuit adapted to be shifted from either of its stable operating states to the other in response to each of successive applied triggering signals of the same polarity, said flip-flop circuit comprising a pair of cross-coupled transistors, each having an input electrode and an output electrode, and direct-current means connecting the input electrode of each transistor to the output electrode of the other, said output electrodes assuming one or the other of two different potentials according to the state of the flip-flop; a third transistor having an inner zone of one conductivity type, and two outer zones of the other conductivity type and having junctions between the outer and inner zones; means for applying to one outer zone a potential corresponding substantially to that at the output electrode of one of said flip-flop transistors; and means for applying to the other outer zone a potential corresponding substantially to that at the output electrode of the other of said flip-flop transistors; and means for applying successive triggering pulses of like polarity to the inner zone of said third transistor to shift the state of said flip-flop circuit in response to each applied triggering pulse.

9. A flip-flop circuit adapted to be shifted from either of its stable states to the other in response to each of successive input pulses of the same polarity, said circuit comprising, in combination, a first and a second semi-conductive device of the same conductivity type, each of said devices including a base and a collector electrode, and direct-current means connecting the base of each device to the collector of the other; steering means comprising a substantially symmetrical transistor having an inner zone and two outer zones and junctions therebetween; circuit means interconnecting said flip-flop circuit and said transistor for applying to one of said outer zones a potential corresponding to that at the collector of one of said semi-conductive devices and for applying to the other outer zone a potential corresponding substantially to that of the collector of said other semi-conductive device; and circuit means coupled to the inner zone of said transistor for receiving input pulses of the same polarity for forward biasing one or the other of said junctions according to the state of said flip-flop, thereby to turn on said transistor and to cause current to flow therethrough in one direction or the other according to which junction is forward biased by said input pulse, said transistor current flowing through said interconnecting circuit means and being effective to shift the state of said flip-flop.

10. A transistor flip-flop comprising a pair of similar transistors each having at least an input electrode and an output electrode and direct-current means connecting the input electrode of each flip-flop transistor to the output electrode of the other, each output electrode assuming one or the other of two different potentials in accordance with the state of the flip-flop, one output electrode assuming one of said potentials and the other output electrode assuming the other for a given state of the flip-flop; steering means for changing the state of said flip-flop in response to each of a succession of trigger pulses of like polarity, said steering means comprising a transistor having an inner zone of one conductivity type and two outer zones of the other conductivity type, and having junctions between the zones, circuit means for coupling one of said outer zones to said flip-flop for applying a bias to said one outer zone substantially equal to one of said potentials assumed by the output electrode of said flip-flop transistors, and circuit means for coupling the other of said outer zones to said flip-flop for applying a bias to said other outer zone, substantially equal to the other of said potentials assumed by the output electrodes of said flip-flop transistors; and means for applying to the inner zone of said steering transistor a succession of trigger pulses of like polarity.

11. A transistor flip-flop adapted to be shifted from one stable state to the other in response to each of successive input pulses of like polarity, said flip-flop comprising, in combination, a pair of cross-coupled transistors of similar conductivity type, each transistor having an input electrode connected to an output electrode of the other transistor; steering means comprising a transistor having an inner zone of one conductivity type and two outer zones of the opposite conductivity type and junctions therebetween; circuit means interconnecting said flip-flop and steering transistor for applying to one outer zone a potential corresponding to that at the output electrode of one of the flip-flop transistors and for applying to the other outer zone a potential corresponding substantially to that at the output electrode of the other flip-flop transistor; and means for applying input pulses of like polarity successively to the inner zone of said steering transistor, each of said input signals being of a polarity to forward bias the junction between the inner zone and one of the outer zones, thereby to cause current to flow through said steering transistor in one direction or the other depending upon which junction is forward biased by the particular input pulse, the flow of said transistor current through said interconnecting means causing the state of said flip-flop to shift.

12. A complementing flip-flop circuit adapted to be shifted from one stable state to the other in response to each of successive input pulses of like polarity, said circuit comprising, in combination, a pair of cross-coupled semi-conductor devices of similar conductivity type forming the flip-flop, each of said devices having an input electrode connected to an output electrode of the other device, each output electrode assuming one or the other of two potentials according to the state of the flip-flop; a third semi-conductor trigger device having an inner zone of one conductivity type and two outer zones of the opposite conductivity type; circuit means intercoupling each of the outer zones of said trigger device to an output electrode of one of the cross-coupled devices such that one outer zone receives a bias potential corresponding to that at the output electrode of one of said cross-coupled devices and the other outer zone receives a bias potential corresponding to that at the output electrode of the other of said cross-coupled devices; and means for applying input pulses of like polarity successively to the inner zone of said trigger device to cause the state of said flip-flop to change in response to each applied input pulse.

13. A complementing flip-flop comprising a bistable device; said device comprising first and second cross-coupled transistors each having at least base and collector electrodes; a steering gate comprising a bidirectional transistor having a base and a pair of outer zones; circuit means connecting one outer zone of the bidirectional transistor to the collector of one of the transistors of the device; circuit means connecting the other outer zone of the bidirectional transistor to the collector of the other transistor of the device; alternating-current circuit means connecting one of said outer zones to the base of one of the transistors of the device; an input terminal for the complementing flip-flop; and circuit means connecting the input terminal of the complementing flip-flop to the base of the bidirectional transistor.

14. A complementing flip-flop comprising a bistable device; said device comprising first and second cross-coupled transistors each having at least base and collector electrodes; a steering gate comprising a bidirectional transistor having a base and a pair of outer zones; circuit means connecting one outer zone of the bidirectional transistor to the collector of one of the transistors of the device; circuit means connecting the other outer zone of the bidirectional transistor to the collector of the other transistor of the device; first circuit means connecting one of the outer zones to the base of one of the transistors of the device, second circuit means connecting the other outer zone to the base of the other transistor of the device; an input terminal for the complementing flip-flop; and circuit means connecting the input terminal of the complementing flip-flop to the base of the bidirectional transistor.

15. A complementing flip-flop comprising first and second transistors, each of said transistors having a base, an emitter and a collector; a first base resistor connecting the base of the first transistor to the collector of the second transistor; a second base resistor connecting the base of the second transistor to the collector of the first transistor; a first load resistor adapted to connect the collector of the first transistor to a source of collector potential; a second load resistor adapted to connect the collector of the second transistor to a source of collector potential; a bidirectional transistor having a base and first and second outer zones; a first gate resistor connecting the first outer zone to the collector of the second transistor; a second gate resistor connecting the second outer zone to the collector of the first transistor; a first capacitor connecting the first outer zone to the base of the first transistor; and a second capacitor connecting the second outer zone to the base of the second transistor; the base of said bidirectional transistor adapted to have applied thereto complementing pulses.

16. A complementing flip-flop comprising first and second transistors, each of said transistors having a base, an emitter and a collector; a first base resistor connecting the base of the first transistor to the collector of the second transistor; a second base resistor connecting the base of the second transistor to the collector of the first transistor; a first load resistor adapted to connect the collector of the first transistor to a source of collector potential; a second load resistor adapted to connect the collector of the second transistor to a source of collector potential; a bidirectional transistor having a base and first and second outer zones; a first gate resistor connecting the first outer zone to the collector of the second transistor; a second gate resistor connecting the second outer zone to the collector of the first transistor; first alternating-current coupling means connecting the first outer zone to the base of the first transistor; and second alternating-current coupling means connecting the second outer zone to the base of the second transistor; the base of said bidirectional transistor adapted to have applied thereto complementing pulses.

17. A circuit comprising a bistable transistor circuit including a pair of transistors each having base, collector and emitter electrodes, a pair of load resistors individually connected to the collector electrodes of said pair of transistors, means for coupling the collector electrode of each of said pair of transistors to the base electrode of the other of said pair of transistors, and having two outputs of opposite polarity, a trigger input transistor having a base electrode and two other electrodes which are individually connected to the outputs of said bistable transistor circuit, said trigger input transistor being of a type having equal gain in either direction of conduction, and means for applying trigger pulses to the base electrode of said trigger input transistor.

References Cited in the file of this patent

UNITED STATES PATENTS

| | | |
|---|---|---|
| 2,226,459 | Bingley | Dec. 24, 1940 |
| 2,570,978 | Pfann | Oct. 9, 1951 |
| 2,655,625 | Burton | Oct. 13, 1953 |
| 2,675,474 | Eberhard | Apr. 13, 1954 |
| 2,691,073 | Lowman | Oct. 5, 1954 |
| 2,706,811 | Steele | Apr. 19, 1955 |
| 2,762,874 | Barco | Sept. 11, 1956 |
| 2,763,832 | Shockley | Sept. 18, 1956 |
| 2,764,343 | Diener | Sept. 25, 1956 |
| 2,797,327 | Kidd | June 25, 1957 |
| 2,816,238 | Elliott | Dec. 10, 1957 |

OTHER REFERENCES

Publication entitled "Transient Analysis of Transistor Amplifiers," by W. F. Chow et al., Electronics, November 1953, page 189, Fig. 1.